United States Patent [19]

Wade

[11] Patent Number: 5,103,424
[45] Date of Patent: Apr. 7, 1992

[54] MEMORY COLUMN INTERFACE WITH FAULT TOLERANCE

[75] Inventor: Cameron B. Wade, Lakewood, Calif.
[73] Assignee: TRW Inc., Redondo Beach, Calif.
[21] Appl. No.: 498,882
[22] Filed: Mar. 26, 1990
[51] Int. Cl.$^5$ ............................................. G11C 8/00
[52] U.S. Cl. ........................... 365/200; 371/10.2; 365/189.02
[58] Field of Search ............ 365/200, 189.02, 189.04, 365/189.01, 230.02, 230.03; 371/10.2, 11.1

[56] References Cited

U.S. PATENT DOCUMENTS

4,471,472 9/1984 Young ................................. 365/200
4,653,050 3/1987 Vaillancourt ....................... 365/200 X

Primary Examiner—Joseph A. Popek
Attorney, Agent, or Firm—Noel F. Heal; Ronald L. Taylor

[57] ABSTRACT

A memory circuit for controlling writing and reading operations in a large semiconductor memory having multiple modules, some of which are subject to production or environmentally caused defects. Memory modules are arranged in columns and there is a column interface for each column, each module being connected to its column interface by a single-bit data line. Each column interface includes a configuration register that is used to record an association between the memory modules in the column and selected data bit positions of an external data word. The same association is used both during writing operations, wherein data words are written from the data bus to the memory modules, and during reading operations, wherein data words are read from the memory modules to the data bus. The interface may be controlled to write data to and read data from the configuration register itself, and the register is subject to automatic testing for invalid patterns of bits associating the memory modules with data bus bit positions.

16 Claims, 5 Drawing Sheets

MEMORY COLUMN INTERFACE WITH FAULT TOLERANCE

This invention was made with Government support under N0039-85-C-0111, awarded by the Department of the Navy. The Government has certain rights in this invention.

BACKGROUND OF THE INVENTION

This invention relates generally to semiconductor memory structures and, more particularly, to very large memory arrays, which have a relatively high probability of containing defective memory cells. A semiconductor integrated-circuit memory takes the form of a two-dimensional array of memory cells fabricated together on a single semiconductor chip. Each memory cell typically stores one binary digit or bit of information, and the array is usually designed to store multiple "words" of information, each word having the same number of bits. A common data word length is eight bits, which is referred to as a "byte." For convenience in handling binary cell addresses, the number of words in a memory array is usually a power of two, such as 1,024, 2,048, 4,096, and so forth. Each 1,024 words or bytes of memory is often referred to as "1k" of memory. For example, a 2k memory contains 2,048 words, bytes or bits of memory.

As the area of a semiconductor chip increases, so does the probability that there will be manufacturing defects within the chip. The manufacturing "yield" is the percentage of defect-free chips obtained in a production run. The probability of occurrence of manufacturing defects in a unit surface chip area is approximately constant for a particular fabrication process. Therefore, larger chips will have more defects and a lower yield of defect-free circuits. Although the area of a specific circuit can be decreased by further reducing the scale of integration, i.e. by reducing the size of the circuit features and their spacing, this will ultimately result in an increase in the number of defects and a reduction in the production yield.

An alternative to reducing the size of a circuit is to increase the effective production yield by rendering the resulting circuits more tolerant to defects, so that defective circuits can be repaired rather than discarded. Basically, this approach involves designing the circuit to include redundant or spare components, which can be connected into the circuit to replace components that have become defective.

Another source of defects is radiation damage. This is highly significant for applications of circuitry to be used in space, where memory cells are subject to damage by cosmic radiation. If only a single memory cell were to be damaged, the defect could be overcome by the use of an appropriate error detection and correction technique. A single-bit error in a relatively large data word can be detected and corrected in this way without the need for reconfiguring the circuitry. However, there is a high probability that a cosmic radiation "strike" on a memory cell would disable not just one cell, but several physically adjacent cells as well. If these damaged cells were all in the same data word, recovery by error detection and correction methods would not be possible. Accordingly, the ideal technique for reconfiguring a memory circuit should be one that minimizes the effects of radiation damage, and permits reconfiguration at any time after manufacture of the circuit.

Without some technique for increasing the production yield of semiconductor memory arrays, the size of such arrays is effectively limited and may not be easily increased to encompass an entire semiconductor wafer. U.S. Pat. No. 4,653,050 to Vaillancourt proposes a solution to this problem, whereby a large memory array comprises a number of memory modules, each of $1 \times N$ bits in size. The memory array is treated as having P logical "pages," each with N multibit words. Each module provides one bit of memory at the same bit position in every word in a logical page of memory. A damaged module therefore affects only one bit in each word, and the missing bit can be reconstructed using conventional error detection and correction techniques. A memory mapping module provides transformation from logical memory addresses to physical addresses within the modules. Although this approach is satisfactory in many applications, it has the disadvantage that a single, relatively complex memory mapping unit is responsible for mapping memory locations for the entire memory array.

An ideal wafer-scale memory array has the ability to distribute each bit of a stored data word to a different memory module. However, for a 32-bit data word, for example, this would appear to require that a 32-bit data bus be connected to each of the memory modules in the array. This routing of the data bus over a large area of the circuit would render the array more vulnerable to defects, whether resulting from manufacture or from radiation damage. Therefore, any scheme for minimizing damage to the memory array should minimize the extent to which the data bus has to be routed throughout the array. The present invention achieves this end and has other significant advantages.

SUMMARY OF THE INVENTION

The present invention resides in a memory circuit in which multiple modules are associated with selected bit positions of data words to be stored in the memory, but without having to connect a relatively wide data bus to every memory module and without the need for a complex logical addressing scheme.

Briefly, and in general terms, the circuit of the present invention comprises a plurality of memory modules, a set of address lines for addressing the modules, and a column configuration interface for each column of memory modules, for effecting data writing and reading operations between the memory modules and an external data bus to which the interface is connected. Each memory module has a plurality of one-bit memory elements, arranged in a plurality (C) of columns, each containing a plurality (N) of memory modules, and the address lines provide for simultaneous addressing of correspondingly positioned bits in the memory modules, whereby the memory bits addressed by any combination of signals on the address lines together form an $N \times C$ matrix for the storage of one data word. The column configuration interface includes a plurality (N) of single-bit data lines connected to the respective memory modules in a column, and further includes configuration means, for connecting the single-bit data lines to selected bit positions of the external data bus, for reading and writing operations. A word of data from the external data bus may be stored with its component bits distributed over selected memory modules.

Preferably, the memory modules in each column are divided into two approximately equal half-columns, and the column configuration interface is positioned between the half-columns of each column, to minimize signal path lengths between the column configuration interface and the memory modules of the column.

More specifically, the external data bus has a width of up to N×M bits, where M is less than or equal to the number of columns C, and the configuration means is capable of associating each memory module of a column with one of M bit positions in the data word, such that each module in the column is connectable to one of a different group of M bit positions. In this way, an entire column of modules is connectable to as many as N bit positions selected from N different groups of M bit positions.

In the illustrative embodiment of the invention, the configuration means includes a configuration register having one bit for each bit position of the external data bus, and having a plurality (N) of fields, corresponding to the N memory modules of the column, each of the N fields being M bits wide. Each of the N fields of the configuration register has, in normal operation, only one bit in a selected state, to indicate the bit positions of the external data bus that are to be associated with each of the N memory modules of the column.

The configuration means includes data multiplexing means and data demultiplexing means. The data multiplexing means is used in writing data from the external data bus to the memory modules, by selecting as many as N data bits from the external data bus, as determined by the states of the bits in the configuration register, and connecting the selected data bits to the single-bit data lines to the N memory modules. The data demultiplexing means is used in reading data from the memory modules to the external data bus, by connecting each bit of data read over the N single-bit data lines to the bit positions of the external data bus defined by the states of the bits in the configuration register.

Preferably, the configuration means further includes means for writing data into the configuration register and means for reading data from the configuration register. This permits the register to be cleared, initialized with a selected data pattern, and read for test purposes.

Another important aspect of the invention is that the configuration means also includes means for detecting fault conditions in the configuration register. Specifically, this fault detection means includes logic for generating a fault signal if more than one bit in any of the N fields of the configuration register is set to the selected state.

In most practical applications of the invention, the width of the external data bus is less than the total number of memory modules N×C. Some of the modules may then be designated as unused, by storing a selected pattern of bits in the configuration register fields corresponding to the unused memory modules.

It will be appreciated from the foregoing that the present invention represents a significant advance in memory circuits intended for reconfiguration to take account of defective modules. In particular, the invention allows for association of each memory module with a selected bit position of a data bus, but without the need for connecting the entire data bus to each of the memory modules. Other aspects and advantages of the invention will become apparent from the following more detailed description, taken in conjunction with the drawings.

DESCRIPTION OF THE PREFERRED EMBODIMENT

As shown in the drawings for purposes of illustration, the present invention is concerned with a semiconductor memory architecture that has the advantage of distributing the bits of each stored data word over a number of different memory modules. In accordance with the invention, the memory modules are arranged in columns, and a column configuration interface is provided for each column, to define bit assignments for the modules in the column. As will be clarified in the following description, the column configuration interface also includes fault detection logic to ensure the column does not operate on erroneous configuration data, and test interface logic to provide reading and writing access to the configuration interface itself.

As briefly described in the background section of this specification, the problem addressed by the invention is how to best configure a large semiconductor memory circuit formed on a single wafer, to be tolerant to failures caused both during and after fabrication of the circuit. If a large memory circuit were to be configured in conventional manner, with all bits of a stored "word" of memory being located in a single memory module, the data word would be vulnerable to defects, which may affect large portions of single modules. Therefore, the principal goal of this and earlier memory circuits of the same general type has been to ensure that the data bits making up a single data word to be stored are distributed over a large number of physically separate memory modules. Then, if one module becomes defective, the missing bit of data can usually be recovered using conventional error detection and recovery techniques.

One way to satisfy the goal of bit distribution would be to route a data bus to all of the memory modules. Then any data bit position could be assigned to any memory module, giving complete flexibility of memory configuration. Unfortunately, routing a large data bus to multiple memory modules on a semiconductor wafer poses additional problems of reliability and efficient use of wafer surface area. Another possibility is to permanently assign each memory module to perform the storage function for a particular bit position of the stored data word. This meets the requirement of distributing the bits of a data word over multiple memory modules, and also avoids having to run a wide data bus to every module. However, the arrangement does not permit reassignment in the event of defects discovered in one or more memory modules.

The present invention provides a simple but effective compromise to this dilemma. The manner in which the invention assigns data bit positions to multiple memory modules is best shown in the diagrammatic view of FIG. 1. A plurality of memory modules, indicated by reference numeral 10, are arranged in a matrix of rows and columns. Each module 10 has the capacity to store some large number of bits, such as 2,048, usually referred to as 2k, or 32,768 (32k), and each addressable memory element in a module is one bit. For example, each memory module, if 1×32k in size, would have fifteen address lines (not shown in FIG. 1) to provide the ability to address each bit of memory individually. Each cross-sectional "slice" through this matrix of memory modules is used to store one data "word." In the illustrative embodiment of the invention, a data word has 39 bits, bits 0-38, and there are six columns of modules, with eight modules in each column and a total of 48 modules. This leaves nine spare modules after assigning one to each of the 39 bits of the data word. It would be possible to have only five columns, i.e. 40 modules in all, but this would leave only one spare.

Figure 1:
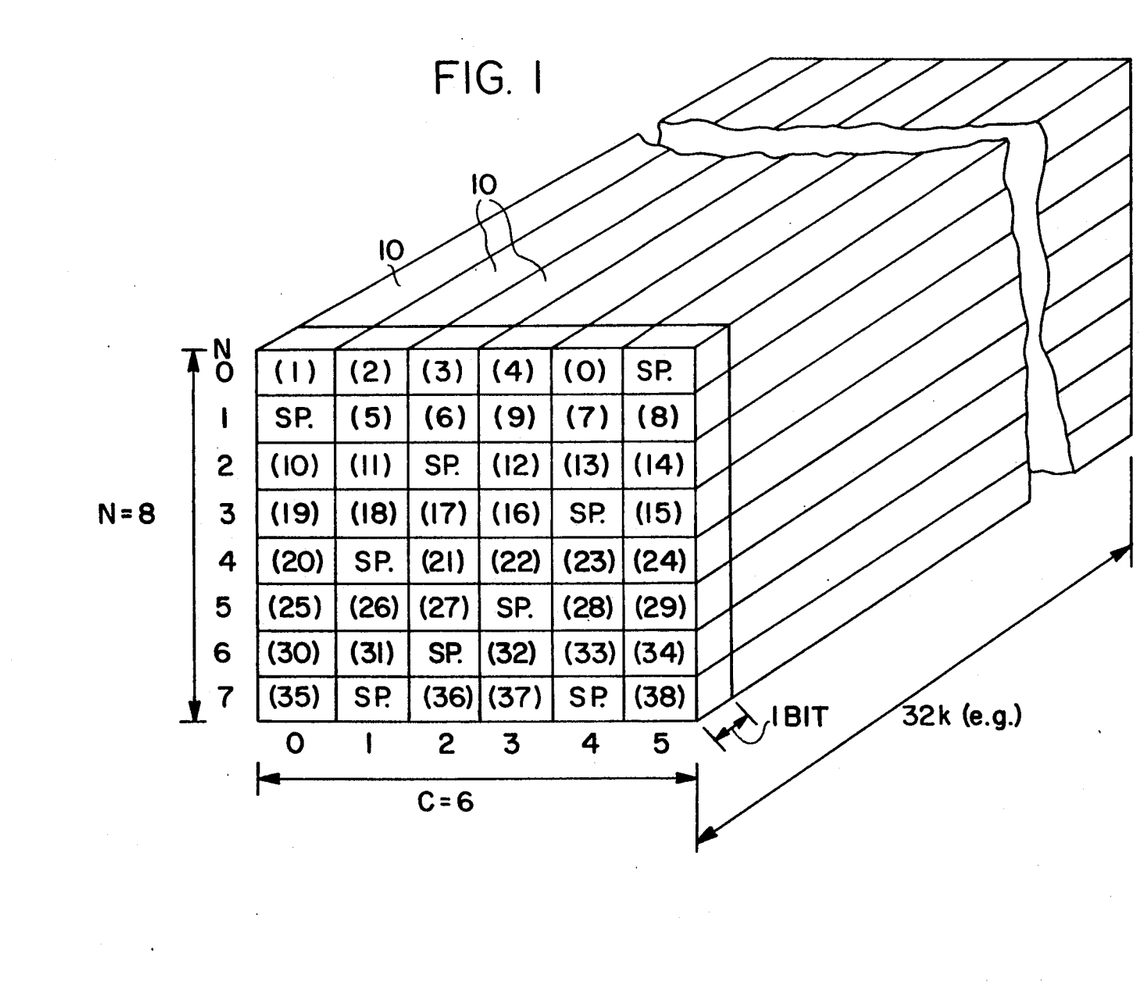
FIG. 1 is a diagrammatic view of a memory circuit having a set of memory modules configured in accordance with the invention.

In general, there are N rows of modules, and every module has the ability to be assigned one of M bit positions in the data word, where N×M is equal to or greater than (by less than M) the number of bit positions in the data word. In the present example, N=8 and M=5, except in the last row, where each module can be assigned to one of only four bit positions. For the first row, row 0, each module can be assigned one of the bit positions 0-4. The possible assignment of bit positions to the various rows are as follows:

| Row 0 | Bit Positions | 0-4 |
|-------|---------------|------|
| Row 1 | Bit Positions | 5-9 |
| Row 2 | Bit Positions | 10-14 |
| Row 3 | Bit Positions | 15-19 |
| Row 4 | Bit Positions | 20-24 |
| Row 5 | Bit Positions | 25-29 |
| Row 6 | Bit Positions | 30-34 |
| Row 7 | Bit Positions | 35-38 |

Within this constraint, the bit positions can be assigned in any manner. FIG. 1 gives an example of bit assignments, with one spare or defective module in each of the rows 0-6 and two spare or defective modules in row 7.

Figure 2:
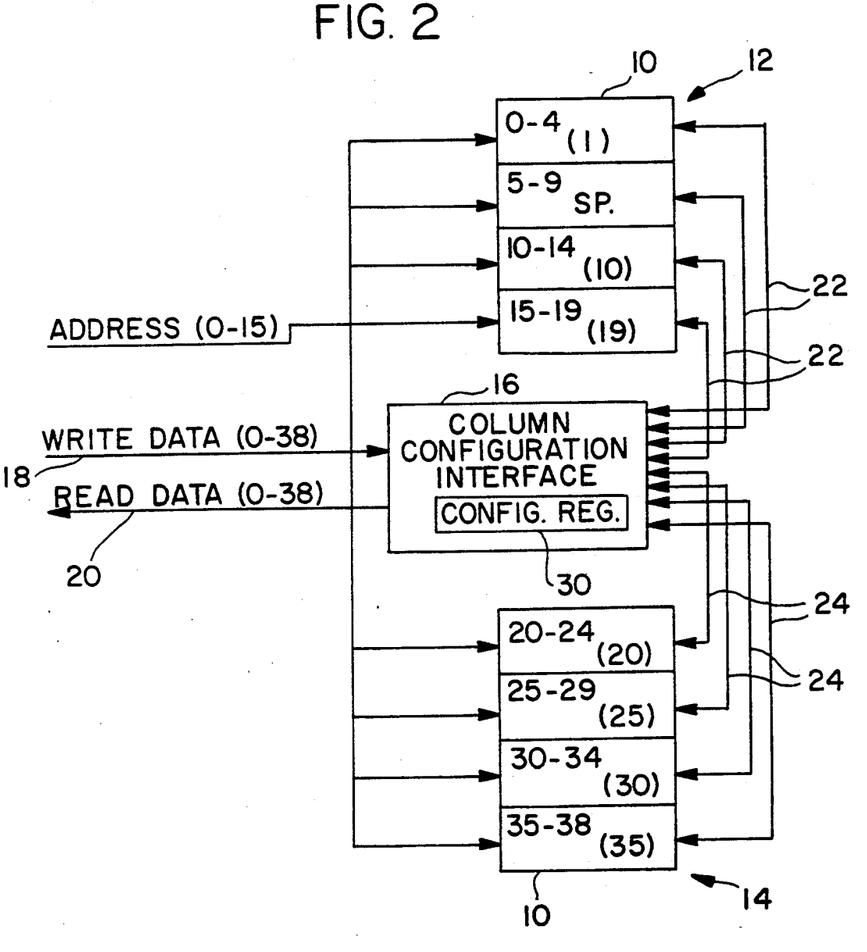
FIG. 2 is a simplified schematic view of one column of memory modules of the memory circuit of the invention.

FIG. 2 shows in more detail and arrangement of one column of the memory modules 10. Preferably, the column of eight modules is divided into an upper half-column 12 and a lower half-column 14, each with four modules 10. Located between the two half-columns 12 and 14 is a column configuration interface 16. A set of 38 write data lines 18 is shown as supplying input to the interface 16 and a set of the same number of read data lines 20 is shown as receiving output from the interface. With appropriate logic design, one set of lines may serve both purposes, but it will be helpful to consider them as separate for purposes of explanation. Four single-bit data lines 22 extend from the interface 16 to the four modules of the upper half-column 12 and four single-bit data lines 24 extend from the interface to the four modules of the lower half-column 14. As will be described in more detail, the column configuration interface 16 includes a 39-bit configuration register 30, and performs related mapping functions during read and write operations. In writing data to the memory modules 10, the interface selects eight bits of data from the write data lines 18 and transmits these over the eight single-bit lines 22, 24 to the upper half-column 12, and the lower half-column 14. During a read operation, data is received at the interface 16 over the same lines 22, 24, and transmitted onto appropriate bit positions of the read data lines 20.

The selection of a particular "bit slice" of the matrix of memory modules for reading and writing is determined by signals on a set of memory address lines 31, which are connected to all of the memory modules 10. The number of address lines, which reflects the size of the memory modules, is not critical to the invention.

Figure 3:
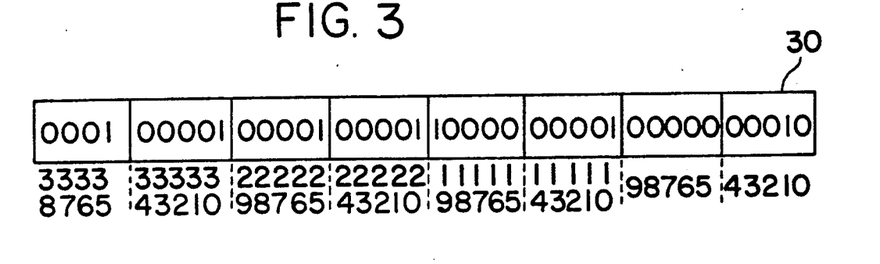
FIG. 3 shows a typical format for the configuration register of the invention.

The configuration register 30 functions basically as a bit map to control the assignment of memory modules 10 to preselected bit positions of data words on the write data lines 18 and the read data lines 20. FIG. 3 shows the register 30 containing bit assignments consistent with the example of FIGS. 1 and 2. Each five-bit field in the register defines the bit assignment for one of the memory modules 10. Bits 5-9 of the register 30 are all zero, indicating normal off or spare state for the second-row memory module of the this column. The other bit assignments for the column are 1, 10, 19, 20, 25, 30 and 35.

Figure 4:
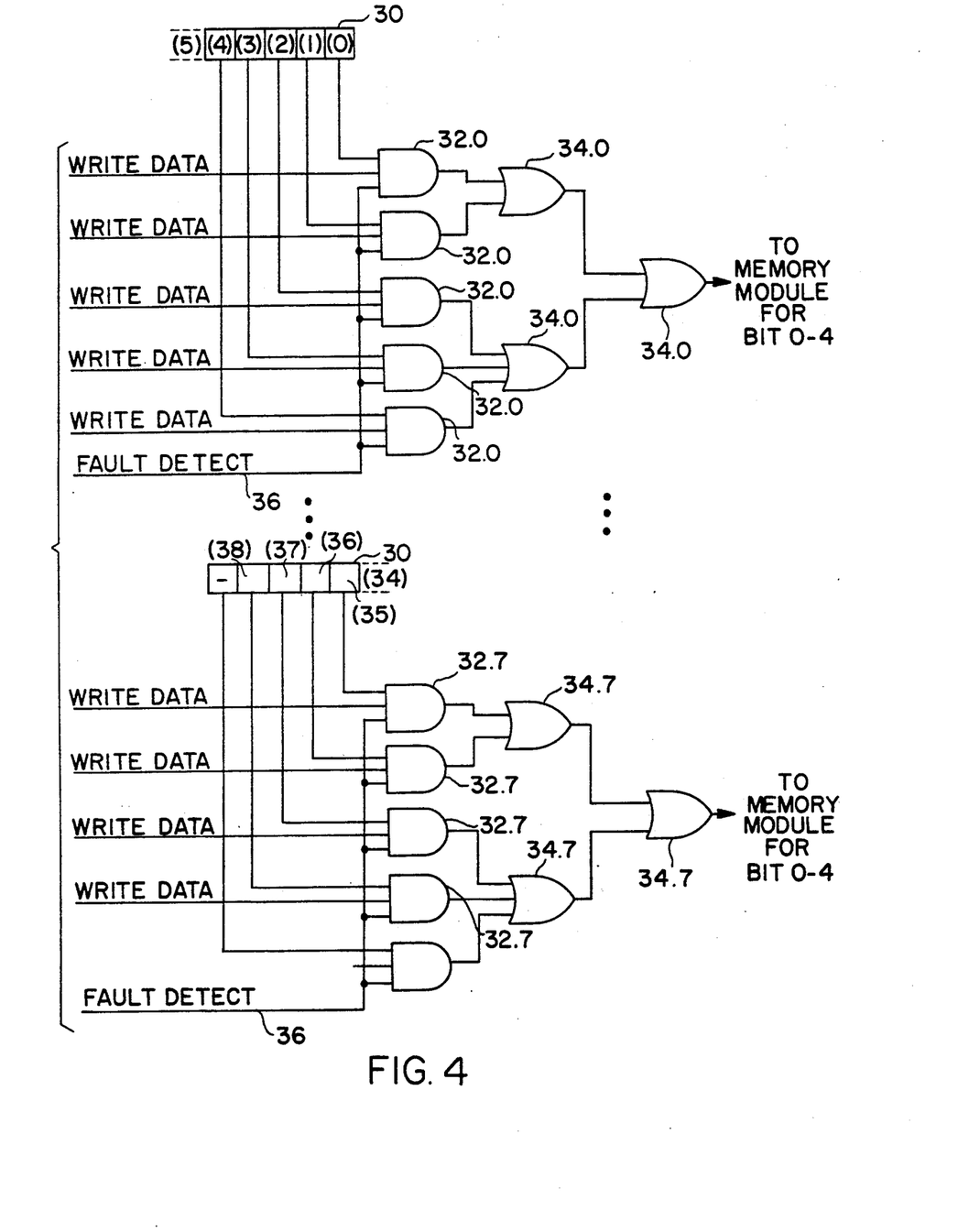
FIG. 4 is a simplified schematic view showing multiplexing of data during a write operation performed in the memory circuit of the invention.

During a write operation, the interface 16 performs a multiplexing function, as shown by the logic diagram of FIG. 4. To derive each bit of data for writing to a memory module, the interface 16 has multiplexing logic that includes five AND gates 32 and three OR gates 34. The five AND gates associated with the first group of data bits (bit numbers 0-4) are referred to as 32.0, and the 0 gates as 34.0, using a suffix corresponding to the row number of the corresponding memory module. The last-row sets of AND gates 32.7 and OR gates 34.7 are also shown in FIG. 4, but the other six sets of identical logic have been omitted. As indicated in the figure, the AND gates 32.0 in the first-row logic receive as respective inputs the first five bits of write data on lines 18, i.e. bits 0-4 of the write data. A second set of inputs to the AND gates 32.0 is derived from the first four bits (0-4) of the configuration register 30. Thus, if bit 1 of the configuration register is a logical "1" or "high" only the AND gate 32.0 corresponding to write data from bit position 1 will be gated through the AND gates. The outputs of the AND gates 32.0 are connected as inputs to the OR gates 34.0. In the circuit as illustrated, three of the AND gate outputs are connected to one OR gate and two to another OR gate, the outputs of the two OR gates being themselves ORed together in the third OR gate. This is equivalent to ORing all five AND gate outputs together to provide a single output on line 22, which carries a single bit of write data to the first-row memory module 10.

A third input to each of the AND gates 32.n is a fault detect signal on line 36, the derivation of which will be subsequently explained. For now, it need only be understood that the fault detect signal on line 36 will be high if no faults have been detected in the configuration register 30, and will be low upon the detection of a fault condition of some kind. Thus the fault detect line 36 operates as an enabling signal for the AND gates 32.n, and if in a low condition, produces all-zero outputs from the OR gates 34.n, such that zero data is written into memory.

The other sets of AND gates 32.n and OR gates 34.n are connected in the same way to provide other single-bit outputs on lines 22, 24 to the other memory modules 10. It will be appreciated that the logic of the AND gates 34.n and OR gates 34.n is performing a data multiplexing operation, i.e. selecting a total of N bits (eight in the illustrative embodiment) from a write data line having as many as N×M bits (39 in the illustrative embodiment).

Figure 5:
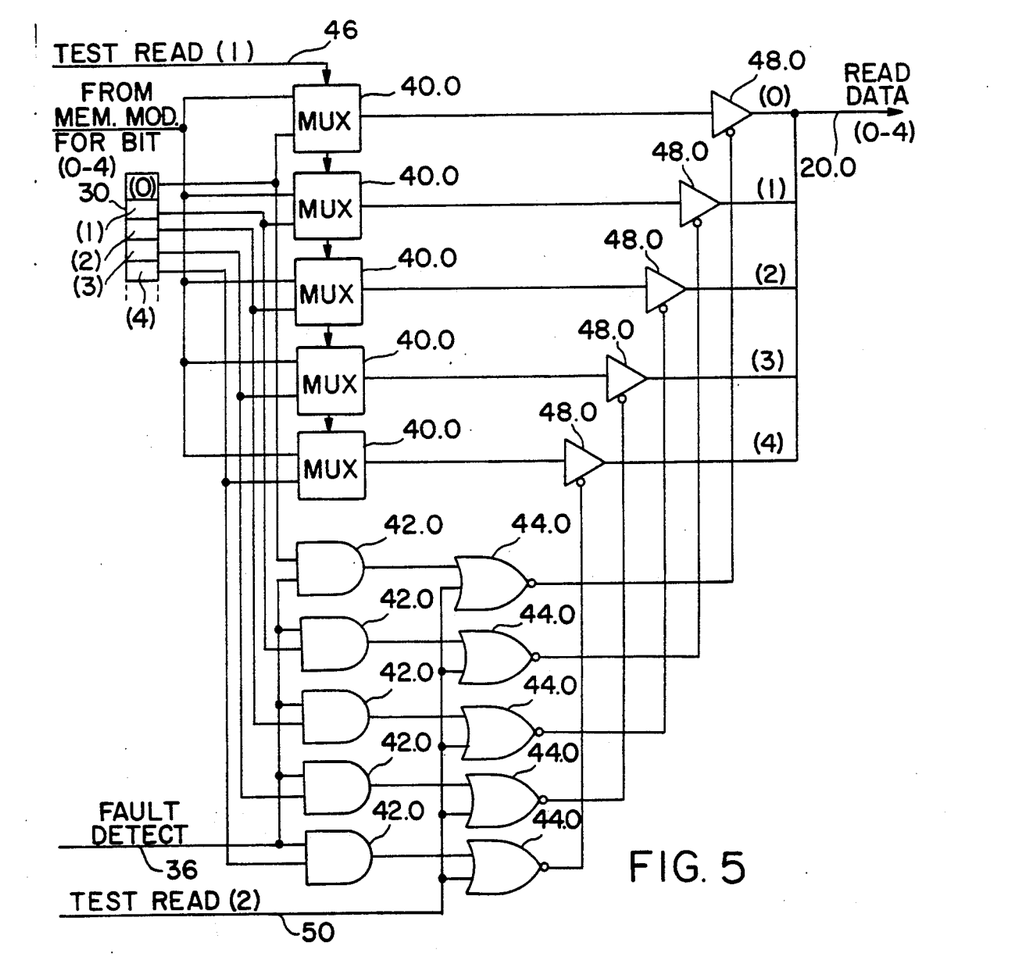
FIG. 5 is a simplified schematic view showing demultiplexing of data during a read operation performed in the memory circuit of the invention.

During a read operation, the interface 16 performs a data demultiplexing function, receiving N single-bit data lines from the N memory modules in a column, and assigning these data bits to N selected bit positions on the read data lines 20. The other column interfaces also each provide five bits of data assigned to preselected bit positions, except that the row-7 interface provides only four bits of data. All of the column interfaces 16 function together to provide a total of 39 bits to the read data lines 20. One implementation of this demultiplexing function is depicted in FIG. 5, which shows demultiplexing logic for only the first five bits of data, i.e. for bits 0-4 of the read data, read from the first-row position of the column. It will be understood that there is identical logic in the interface 16 to process data from the other seven row positions in the column.

As shown in FIG. 5, bits 0-4 of the configuration register 30 are connected respectively to five 2-to-1 multiplexers 40.0 and also to five AND gates 42.0, the other input of which is the fault detect line 36. If there are no detected faults in the interface 16, the five bits 0-4 from the configuration register 30 are gated through the AND gates 42.0 to a set of five NOR gates 44.0. The MUXs 40.0 have bits 0-4 of the configuration register 30 as one set of inputs and have the single bit read from the memory module of row 0 for the other input. This bit of data read from the row-0 memory module is applied in parallel to all of the MUXs 40.0. The selection or control signal applied to the MUXs 40.0 is a first test read signal on line 46, the purpose of which will be explained shortly. If the interface 16 is in operational mode, i.e. is set to read or write data into the memory modules 10, the MUXs 40.0 will select data from the memory module, on line 22. Functioning of the circuit in a test mode will also be explained shortly.

The outputs of the MUXs 40.0 are connected to five corresponding tri-state buffers 48.0, the outputs of which are grouped together to provide signals to bits 0-4 of the read data lines 20. The outputs of the buffers 48.0 are enabled by inverted outputs from the NOR gates 44.0. The NOR gates 44.0 have second inputs derived from a second test read line 50, the derivation of which has also yet to be explained. However, in the operational mode of the interface 16, the second test read line 50 will also low, which means that bits 0-4 of the configuration register 30 will pass through the AND gates 42.0 and the OR gates 44.0, and will control enabling of the buffers 48.0. Therefore, in normal operation, only one of the outputs of the buffers 48.0 will be enabled, and this will determine which of five of the read data lines 20 will carry the single bit of data read from the memory module. Again it will be understood that there are seven additional sets of logic identical with that shown in FIG. 5, for deriving up to seven additional data bits read from the memory modules. As also understood, additional interfaces in additional columns provide up to eight data bits each for output onto the read data lines 20.

Figure 6:
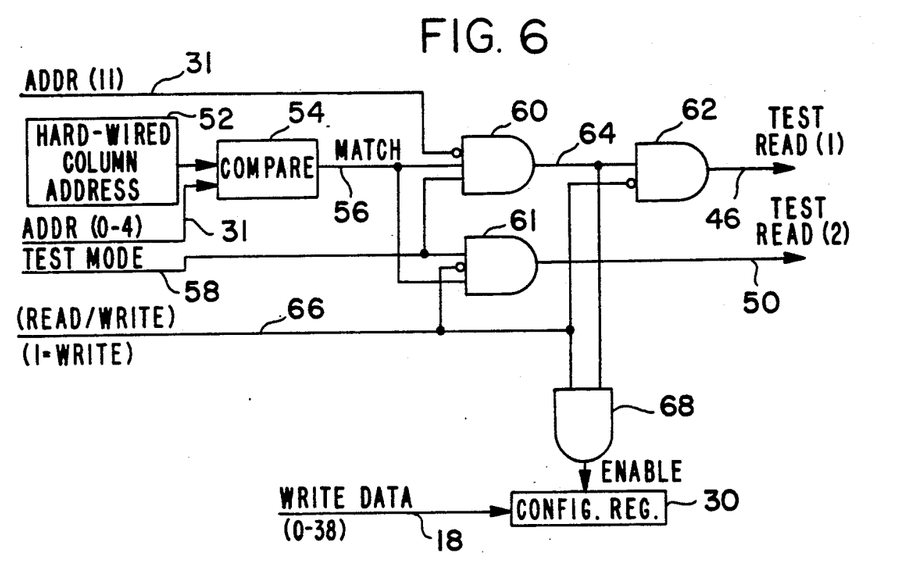
FIG. 6 is a schematic diagram of test interface logic used to generate control signals to control test reading and writing operations.

To facilitate an understanding of the logic of FIG. 5 as it operates in the test mode, the derivation of the first and second test read signals on lines 46 and 50 will first be described, with reference to FIG. 6. The purpose of the test mode is to allow the column interface 16 to be used to write data to and read data from the configuration register 30, and also to read data from the memory modules for test purposes. Since each column has its own configuration register 32, some means must be provided to address the registers separately for this purpose. In the implementation to be described, the five lower-order bits 0-4 of the address lines 31 are also used to address up to thirty-two columns, and each column interface 16 has a unique memory address that is hard-wired into the device, as indicated by block 52. In test interface logic included in each interface 16, the hard-wired column address 52 is compared with bits 0-4 of the address lines 31, in a comparator 54, and a match signal is generated on line 56. This match signal is of no consequence unless a test mode signal, on line 58 is in a high state. The two test read signals are generated in the test interface logic, which also includes three AND gates 60, 61 and 62. AND gate 60 receives as its three inputs the match signal on line 56, the test mode signal on line 58, and the inverted form of bit 11 of the address lines 31. Bit 11 of the address lines is used to indicate whether or not a test read of the memory module is required. If bit 11 of the address lines is low, and the match signal and the test mode signal are both high, AND gate 60 will generate a high output on line 64. This is input to AND gate 62, together with the inverted form of a read/write signal on line 66. The read/write signal is high for a write operation and low for a read operation. Thus, if a read is indicated, the inverted input of line 66 to AND gate 62 will produce a high output on line 46, the first test read signal. The second test read signal on line 50 is produced as an output from AND gate 61, the inputs of which are the inverted read/write signal on line 66, the match signal on line 56 and the test mode signal on line 58. Thus the second test read signal on line 50 is produced when there is a matching column address, and a read operation in test mode, regardless of the condition of bit 11 of the address lines 31. The effect of these two signals on lines 46 and 50 can now be observed with reference to FIG. 5.

The effect of the first test read signal, on line 46, is to control selection in the MUXs 40.0. If the signal on line 46 is low, input is selected from the memory module 10. If the signal on line 46 is high, input is selected from the configuration register 30. The effect of the second test read signal, on line 50, is to control operation of the NOR gates 44.0. If the signal on line 50 is high, this will result in enabling of all five of the buffers 48.0. If the signal on line 50 is low, only the buffer corresponding to "1" in bits 0-4 of the configuration register 30 will be enabled. Basically, there are only three conditions of the two read test signals that are of interest.

If both the read test signals are low, the interface operates in the operational mode, as has been described already with reference to FIG. 5. This is because the low signal on line 46 has the effect of selecting the memory module rather than the configuration register as a source of data to perform a read operation, and because the NOR gates 44.0 are transparent to the passage of a bit configuration from the configuration register 30. If both read test signals are high, the interface operates to read data from the configuration register 30 onto the read data lines 20. This is because the MUXs 40.0 then select the configuration register 30 for a data source, and the NOR gates 44.0 operate to enable all of the buffers 48.0, to provide five bits of data for the read data lines 20. If the first read test signal on line 46 is low and the second read test signal on line 50 is high, the MUXs 40.0 operate to select data from the memory module, i.e. the MUXs each produce a replica of the memory module data bit, and all of the buffers 48.0 are enabled, thus producing five bits of identical data on the read data lines 20. The remaining case, with the first read test signal high and the second read test signal low, is prevented from occurring by design of the logic.

Writing data to the configuration register 30 is logically simpler than reading from it. As also shown in FIG. 6, a signal to enable writing to the configuration register 30 is generated by ANDing together the read/write signal on line 66 and the output of AND gate 60, on line 64. This additional logical AND operation is performed in another AND gate 68, the output of which indicates that the test mode has been selected, that a write operation has been selected, and that there is a column address match, i.e. that the write data is intended for this particular column interface. The output of AND gate 68 is used to enable writing data on the write data lines 18 to the configuration register 30. Such a write operation is used to write all zeros to the register during start-up, to write a desired configuration to the register before operation, or for other test purposes.

Figure 7:
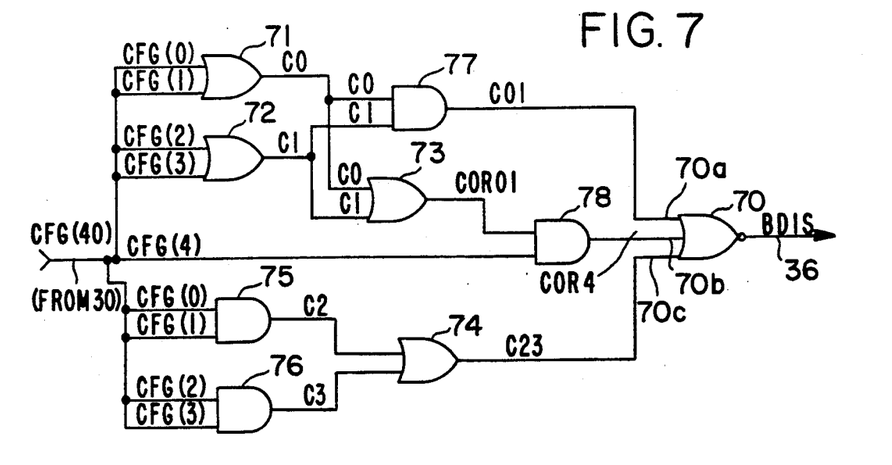
FIG. 7 is a schematic diagram of fault detection logic used to detect fault conditions in the configuration register.

An important aspect of the invention is the detection of faults in the column interface 36, as reflected in the contents of the configuration register 30. In normal operation, each M-bit (5-bit) field of the register will have only one bit that is a logical "1," to indicate the bit assignment for one of the memory modules 10. FIG. 7 provides one implementation of fault detection logic included in the column interface 16. The fault detection logic has as inputs five bits of the configuration register 30, here indicated as bits 0-4, and generates as output the fault detect signal, also referred to as the buffer disable signal, on line 36. Rather than describing this logic in detail, it will be noted that the output signal on line 36 is derived from the output of a NOR gate 70, the three inputs or which, on line 70a, 70b and 70c, are derived from logic that includes four OR gates 71-74 and four AND gates 75-78. It will be apparent from inspection of the logic that the three inputs to the output NOR gate 70 will be a "1" if the following conditions are present:

Input on line 70a is "1" only if bits 0 and 2, or bits 0 and 3, or bits 1 and 2, or bits 1 and 3, are both "1;"

Input on line 70b is "1" only if bit 4 and any other bit (0-3) are both "1;"

Input on line 70c is "1" only if bits 0 and 1, or bits 2 and 3 are both "1."

Therefore, if any two bits are both "1" the output of the NOR gate 70 will be a logical "0."Otherwise, the output on line 36 will be a logical "1,"which is used to enable the multiplexing and demultiplexing logic of FIGS. 4 and 5.

Another source of faults in the column interface 16 is a condition in which one bit of the configuration register 30 becomes "stuck" in a high or logical "1" state. This may not be detected by the fault detection logic unless an attempt is made to select another of the bits in the register field. Then both "1") bits will be detected and the fault detect signal on line 36 will be lowered. Another way to detect a "stuck-at-high" condition is by reading the configuration register after resetting it to all zeros at startup time. It will be recalled that the the test mode signal, in conjunction with the read/write signal, permits a pattern to be written into and read from the configuration register. If zeros are written to the register but nonzero data is read back, a "stuck-at-high" condition may be assumed and appropriate action taken to disable the corresponding memory module. The convention employed in the present embodiment of the invention is that all zeros in configuration register field represent a normal "off" condition, because of a defective memory module, and that all ones in the field represent an "off" condition necessitated because of a detected fault in the register, either more than one "1" bit in the field, or a "stuck-at-high" condition.

It will be appreciated from the foregoing that the present invention represents a significant advance in the field of wafer-scale semiconductor memories. In particular, the invention provides a simple but effective approach to the configuration of memory modules to be resistant to errors caused by defects in one or more modules. Memory modules are assignable to selected bit positions of a data word, but without having to route a full-width data bus to every module. The bit assignment is handled by a simple configuration register in each column of memory modules, and logic is provided to check the configuration register itself for fault conditions. It will also be appreciated that, although an embodiment of the invention has been described in detail for purposes of illustration, various modifications may be made without departing from the spirit and scope of the invention. Accordingly, the invention is not to be limited except as by the appended claims.

I claim:

1. A memory circuit, comprising:
a plurality of memory modules, each having a plurality of one-bit memory elements, the memory modules being arranged in a plurality (C) of columns, each containing a plurality (N) of memory modules, to form a logical three-dimensional memory array;
a set of address lines coupled to each of the memory modules, for simultaneously addressing correspondingly positioned bits in the memory modules, whereby the memory bits addressed by any combination of signals on the address lines together form an N×C matrix for the storage of one data word; and
a column configuration interface for each column of memory modules, for effecting data writing and reading operations between the memory modules and an external data bus to which the interface is connected, the column configuration interface including a plurality (N) of single-bit data lines connected to the respective memory modules in a column, and configuration means, for connecting the single-bit data lines to selected bit positions of the external data bus, for reading and writing operations, whereby a word of data from the external data bus may be stored with its component bits distributed over selected memory modules.

2. A memory circuit as defined in claim 1, wherein:
the memory modules in each column are divided into two approximately equal half-columns; and
the column configuration interface is positioned between the half-columns in each column, to minimize signal paths between the column configuration interface and the memory modules of the column.

3. A memory circuit as defined in claim 1, wherein:
the external data bus has a width of up to N×M bits, where M is less than or equal to the number of columns C;
the configuration means is capable of connecting each memory module in a column to one of M bit positions in the data word, such that each module in the column is connectable to one of a different group of M bit positions, whereby an entire column of modules is connectable to as many as N bit positions selected from N different groups of M bit positions.

4. A memory circuit as defined in claim 3, wherein:
the configuration means includes a configuration register having one bit for each bit position of the external data bus, and having a plurality (N) of fields, corresponding to the N memory modules of the column, each of the N fields being M bits wide; and
each of the N fields of the configuration register has, in normal operation, only one bit in a selected state, to indicate the bit positions of the external data bus that are to be associated with each of the N memory modules of the column.

5. A memory circuit as defined in claim 4, wherein the configuration means further includes:
data multiplexing means for use in writing data from the external data bus to the memory modules, by selecting as many as N data bits from the external data bus, as determined by the states of the bits in the configuration register, and connecting the selected data bits to the single-bit data lines to the N memory modules; and
data demultiplexing means for use in reading data from the memory modules to the external data bus, by connecting each bit of data read over the N single-bit data lines to the bit positions of the external data bus defined by the states of the bits in the configuration register.

6. A memory circuit as defined in claim 5, wherein:
the configuration means further includes means for writing data into the configuration register and means for reading data from the configuration register.

7. A memory circuit as defined in claim 5, wherein:
the configuration means further includes means for detecting faults conditions in the configuration register.

8. A memory circuit as defined in claim 7, wherein:
the means for detecting fault conditions includes logic for generating a fault signal if more than one bit in any of the N fields of the configuration register is set to the selected state.

9. A memory circuit as defined in claim 3, wherein:
the width of the external data bus is less than the total number of memory modules N×C, whereby some of the modules are designated as unused.

10. A memory circuit as defined in claim 4, wherein:
the width of the external data bus is less than the total number of memory modules N×C; and
some of the modules are designated as unused by storing a selected pattern of bits in the configuration register fields corresponding to the unused memory modules.

11. A memory circuit as defined in claim 5, wherein:
the width of the external data bus is less than the total number of memory modules N×C; and
some of the modules are designated as unused by storing a selected pattern of bits in the configuration register fields corresponding to the unused memory modules.

12. A memory circuit, comprising:
a plurality of memory modules, each having a plurality of one-bit memory elements, arranged in a plurality (C) of columns, each containing a plurality (N) of memory modules, to form a logical three-dimensional memory array;
a set of address lines coupled to each of the memory modules, for simultaneously addressing correspondingly positioned bits in the memory modules;
a column configuration interface for each column of memory modules, for effecting data writing and reading operations between the memory modules and an external data bus to which the interface is connected, the column configuration interface including a plurality (N) of single-bit data lines connected to the respective memory modules in a column, and configuration means, for connecting the single-bit data lines to selected bit positions of the external data bus, for reading and writing operations, whereby a word of data from the external data bus may be stored with its component bits distributed over selected memory modules.

13. A memory circuit as defined in claim 12, wherein:
the memory modules in each column are divided into two approximately equal half-columns; and
the column configuration interface is positioned between the half-columns in each column, to minimize signal paths between the column configuration interface and the memory modules of the column.

14. A memory circuit as defined in claim 12, wherein:
the external data bus has a width of up to N×M bits, where M is less than or equal to the number of columns C;
the configuration means is capable of connecting each memory module in a column to one of M bit positions in the data word, such that each module in the column is connectable to one of a different group of M bit positions, whereby an entire column of modules is connectable to as many as N bit positions selected from N different groups of M bit positions.

15. A memory circuit as defined in claim 14, wherein:
the configuration means includes a configuration register having one bit for each bit position of the external data bus, and having a plurality N of fields, corresponding to the N memory modules of the column, each of the N fields being M bits wide; and
each of the N fields of the configuration register has, in normal operation, only one bit in a selected state, to indicate the bit positions of the external data bus that are to be associated with each of the N memory modules of the column.

16. A memory circuit as defined in claim 15., wherein the configuration means further includes:
data multiplexing means for use in writing data from the external data bus to the memory modules, by selecting as many as N data bits from the external data bus, as determined by the states of the bits in the configuration register, and connecting the selected data bits to the single-bit data lines to the N memory modules; and
data demultiplexing means for use in reading data from the memory modules to the external data bus, by connecting each bit of data read over the N single-bit data lines to the bit positions of the external data bus defined by the states of the bits in the configuration register.

* * * * *